United States Patent [19]

Farassat

[11] Patent Number: 5,314,105
[45] Date of Patent: May 24, 1994

[54] WIRE BONDING ULTRASONIC CONTROL SYSTEM RESPONSIVE TO WIRE DEFORMATION

[75] Inventor: Farhad Farassat, Taufkirchen, Fed. Rep. of Germany

[73] Assignee: F & K Delvotec Bondtechnik GmbH, Oberhaching, Fed. Rep. of Germany

[21] Appl. No.: 967,410

[22] Filed: Oct. 27, 1992

[30] Foreign Application Priority Data

Oct. 30, 1991 [GB] United Kingdom ............... 9123047
Sep. 8, 1992 [GB] United Kingdom ............... 9219029

[51] Int. Cl.$^5$ .................. B23K 1/06; B23K 20/10
[52] U.S. Cl. .................. 228/102; 228/110.1; 228/4.5
[58] Field of Search ............ 228/4.5, DIG. 904, 102, 228/110, 1.1

[56] References Cited

U.S. PATENT DOCUMENTS

| | | | |
|---|---|---|---|
| 4,496,095 | 1/1985 | Renshaw et al. | 228/102 |
| 4,555,052 | 11/1985 | Kurtz et al. | 228/4.5 |
| 4,571,688 | 2/1986 | Kashihara et al. | 228/102 X |
| 4,606,490 | 8/1986 | Chan et al. | 228/110 X |
| 4,696,425 | 9/1987 | Landes | 228/102 X |
| 4,808,948 | 2/1989 | Patel et al. | 228/4.5 X |
| 4,824,005 | 4/1989 | Smith, Jr. | 228/4.5 X |
| 4,854,494 | 8/1989 | von Raben | 228/102 |
| 5,060,841 | 10/1991 | Oshima et al. | 228/102 |
| 5,192,015 | 3/1993 | Ingle et al. | 228/110 X |
| 5,213,249 | 5/1993 | Long et al. | 228/110 X |

FOREIGN PATENT DOCUMENTS

| | | | |
|---|---|---|---|
| 63-186436 | 8/1988 | Japan | 228/4.5 |
| 2-260552 | 10/1990 | Japan | 228/904 |

*Primary Examiner*—Paula A. Bradley
*Assistant Examiner*—Jeanne M. Elpel
*Attorney, Agent, or Firm*—Hale and Dorr

[57] ABSTRACT

A wire-bonding process for bonding a wire 8 to a contact surface of an electrical or electronic component 10, comprises supplying ultrasonic energy to a bonding tool 2 mounted on an ultrasonic transducer 6, the bonding tool 2 being arranged to press the wire 8 against the contact surface of the electrical or electronic component 10, and monitoring the deformation of the wire 8. The level and duration of the supply of ultrasonic energy and optionally the magnitude of the bonding force are continuously controlled during the bonding process in response to the deformation of the wire, in a closed loop system.

6 Claims, 4 Drawing Sheets

WIRE BONDING ULTRASONIC CONTROL SYSTEM RESPONSIVE TO WIRE DEFORMATION

BACKGROUND OF THE INVENTION

The present invention relates to a method for controlling a wire-bonding process, in particular a wedge bonding process using aluminium or gold wire, and to the machine for carrying out that method. The method includes the monitoring, during the bonding process, of the quality of the bond between the wire and the surface to which it is to be bonded.

Wire bonding is the process of making electrical connections in semiconductor components by means of fine metal wire, typically wire with a diameter of from 12 microns to 500 microns. Examples of electrical connections which can be made using wire bonding techniques include connections between the contact surfaces of discrete or integrated chips and the contact leads of their packages, and, in the case of hybrid circuits, the connections between inserted monolithic elements and the film circuit which contains them.

A number of wire bonding techniques have been developed, and one which has been particularly successful is a microwelding technique using ultrasound. An automatic wire bonding apparatus on which such a technique can be operated is described in the present applicants U.S. Pat. No. 4,619,397. Aluminium wire, in contact with the contact surface to which it is to be bonded, is moved vigorously in the direction of the surface to which it is to be bonded so that its oxide layer breaks open. The wire is then subjected to pressure, and a permanent junction is created between the two materials. Motion of the wire is generated by an ultrasonic transducer excited by an ultrasonic generator to produce high-frequency mechanical vibrations.

In the particular wire bonding process known as wedge bonding, the ultrasonic energy is supplied at a level depending on the wire size used. The ultrasonic energy is directed to the aluminium wire by a special tool known as a "wedge". The wire is fed through a guide at the bottom of the wedge. When the wedge with the aluminium wire touches the surface to which the wire is to be bonded, movement is stopped. The wire is pressed down with a small defined force, known as the bonding weight, and the wire is slightly deformed. This small deformation is known as the "pre-deformation". Ultrasonic energy is now switched on, and the welding process starts. During this time, the diameter of the aluminium wire is reduced by a few microns, the actual reduction depending on the size, physical properties and the precise chemical nature of the wire.

It is important in an automatic wire bonding apparatus to have as much control as possible over the process, and to be able to determine whether or not a bond has been successfully made. In particular, it is important to be able to ascertain when the wedge with the aluminium wire touches the surface to which the wire is to be bonded, so that movement of the wedge can be stopped. It would also be very useful for the operator of the wire bonding apparatus to ascertain whether a bond has been successfully made at the time of bonding rather than during a subsequent test routine. Because of the very rapid throughput of an automatic wire bonding apparatus, it would be advantageous if the bonding could be monitored immediately at the time of bonding, so that after the formation of an unsatisfactory bond the process can be stopped and the bonding conditions checked to prevent the production of a large number of unsatisfactory bonds, with the consequent wastage of time and expensive components and materials.

Most wire bonding machines currently in commercial use are only able to check whether a successful bond has been made after bonding is completed, using a test known as the loop-pull test. This test is typically used as a destructive test method in which samples are tested to destruction by pulling the loop between two bonds and noting the breaking force which is required, and the point at which the break occurs. In general, bonding is considered to be satisfactory if the wire breaks at the point approximately equidistant between the two bonds at which the force is applied; if the break occurs at the bond itself, with the wire lifting away from the surface to which it was supposed to be bonded, then this is due to the bonding being insufficient. If, alternatively, the wire breaks close to the bond, at the so-called heel, then this is generally the result of over-bonding, when too much pressure or too much ultrasonic energy has been applied to the wire, and the wire has been too highly deformed.

A number of methods have been proposed to check at the time of bonding whether or not a successful bond has been produced, including the method carried out using the apparatus described in the present applicants U.S. Pat. No. 4,984,730. The apparatus claimed in that specification comprises a bonding head comprising a bonding tool mounted on an ultrasonic transducer, a bonding tip of the tool being arranged, in the operation of the machine, to press aluminium wire against the contact surface of an electronic or electrical component, the wire being drawn from a suitable wire supply, and a wire clamp by which the wire drawn from the wire supply may be clamped, the wire clamp being movable backward and forward generally in the direction in which the wire is fed appropriately to position the free end of wire drawn from the spool after completion of a bonding operation, characterised in that the automatic wire-bonding apparatus further comprises means for monitoring, during bonding, the quality of the bond formed between the wire and the surface to which it is to be bonded, by identifying those bonds which do not fall within predetermined maximum and minimum values for deformation of the wire due to ultrasonic excitation. In that patent, the shape of the wire deformation curve is evaluated and compared to a standard curve. If the actual curve deviates too far from the standard curve the machine is stopped.

Most of the known systems control the bonding process by means of controlling the time at which a constant level of ultrasonic energy is supplied to the bond. This has the effect that the time for which energy is supplied and the level of energy supplied are both set for what can be considered as a 'worst case' bond, whereas for many bonds, both the quality of the bond and the efficiency of the bonding process, both in terms of the time taken and the energy consumed would be improved by more accurate control of the ultrasonic energy supply.

BRIEF SUMMARY OF THE INVENTION

It is an object of the present invention to provide a method of controlling a wire bonding process, in particular a wedge bonding process using aluminium wire, in which the above disadvantages are reduced or substantially obviated. It is a further object of the present invention to provide a machine for carrying out that method.

The invention provides a method for carrying out a wire-bonding process for bonding a wire to a contact surface of an electrical or electronic component, which process comprises supplying ultrasonic energy to a bonding tool mounted on an ultrasonic transducer, the bonding tool being arranged to press the wire against the contact surface of the electrical or electronic component and monitoring the deformation of the wire, characterised in that the level and duration of the supply of ultrasonic energy is continuously controlled during the bonding process in response to the deformation of the wire.

In a preferred embodiment, the invention provides a method for carrying out a wire-bonding process for bonding a wire to a contact surface of an electrical or electronic component, which process comprises supplying ultrasonic energy to a bonding tool mounted on an ultrasonic transducer, the bonding tool being arranged to press the wire against the contact surface of the electrical or electronic component and monitoring the deformation of the wire, characterised in that the level and duration of the supply of ultrasonic energy and the magnitude of the bonding force are continuously controlled during the bonding process in response to the deformation of the wire.

The invention further provides an automatic wire bonding apparatus which apparatus comprises a bonding head comprising a bonding tool mounted on an ultrasonic transducer, a bonding tip of the tool being arranged, in the operation of the machine, to press aluminium wire against the contact surface of an electronic or electrical component, the wire being drawn from a suitable wire supply, and a sensor for determining the change in position of the bonding wedge during the bonding process, characterised in that the automatic wire bonding apparatus further comprises means for controlling the supply of energy to the ultrasonic transducer in response to the output of the sensor for determining the change in position of the wedge during the bonding process.

The invention also provides an automatic wire bonding apparatus which apparatus comprises a bonding head comprising a bonding tool mounted on an ultrasonic transducer, a bonding tip of the tool being arranged, in the operation of the machine, to press aluminium wire against the contact surface of an electronic or electrical component, the wire being drawn from a suitable wire supply, and a sensor for determining the change in position of the bonding wedge during the bonding process, characterised in that the automatic wire bonding apparatus further comprises means for controlling the supply of energy to the ultrasonic transducer and the magnitude of the bonding force in response to the output of the sensor, for determining the change in position of the wedge during the bonding process.

It has now been appreciated that the bonding process is not, as has previously been assumed, a single stage process, but is in fact a two or three-stage process, each of which stages is advantageously carried out with the level of ultrasonic energy and optionally the magnitude of the bonding force being supplied at that stage being specifically determined for that stage. In particular, it has been determined that the bonding process comprises a first stage, in which the surfaces of the wire and the substrate to which it is to be bonded are cleaned; a second stage in which welding between the wire and the substrate takes place, and, in the case of thick wires, there is a third stage during which high temperature tempering of the bond area takes place by means of ultrasonic energy.

It has further been observed that each of these stages is advantageously carried out at a different energy level and optionally bonding force which can be empirically determined and controlled during the bonding process. It is in general found that the first, or cleaning, stage requires a relatively high energy level and takes place relatively rapidly; the second, or welding, stage requires a lower energy level and optionally lower bond weight and the third, tempering stage, where this occurs, requires an energy level and optionally bond weight which varies depending on the particular bond.

While it is generally found that the energy levels and optionally bond weight required change as stated above, this is not necessarily the case and it is a particular advantage of the process according to the present invention that the bonding parameters are determined for each individual bond and optimised for that bond.

Even successive bonds formed using the same wire and the same substrate may differ widely in their energy, and optionally bond weight, requirements, and by constantly monitoring the bonding process according to the invention, bonds of a consistent high quality can be achieved with high efficiency, independent of any variations in the bonding conditions.

The system according to the invention is thus an in-line closed loop system. Two alternative embodiments of the process according to the invention and an embodiment of an automatic wire bonding apparatus suitable for carrying out such a process will now be described with reference to the accompanying drawings.

DETAILED DESCRIPTION

Figure 1:
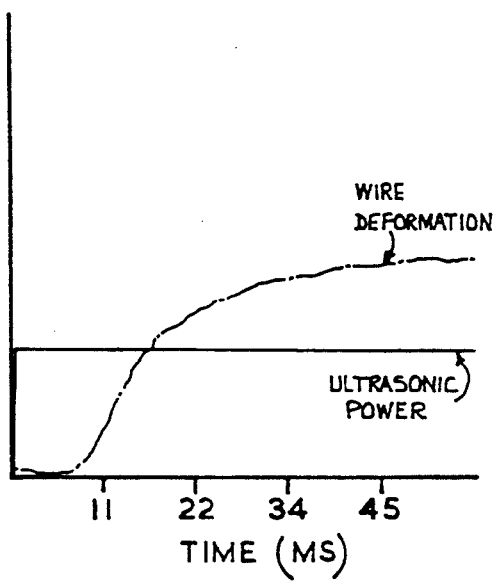
FIG. 1 is a graph showing wire deformation against time using constant ultrasonic energy and constant bond weight (prior art)

In a prior art bonding process as shown in FIG. 1, ultrasonic energy is supplied at a constant level throughout the bonding process. There is an initial period, of approximately 9 milliseconds in which there is little deformation of the wire, followed by a second period during which the deformation of the wire increases sharply and a third period in which there is virtually no further deformation. According to the prior art control systems, a satisfactory bond has been formed because the deformation falls within the preset limits for minimum and maximum permissible wire deformation. However, it is clear from the graph that the energy supplied after approximately 34 milliseconds bonding time has not been usefully used in bonding and there has thus been wastage both of energy and operating time. However, according to the prior art it has not been possible to reduce the bonding time for an individual bond since later bonds between the same wire and the same contact surface might require a longer excitation time.

Figure 2:
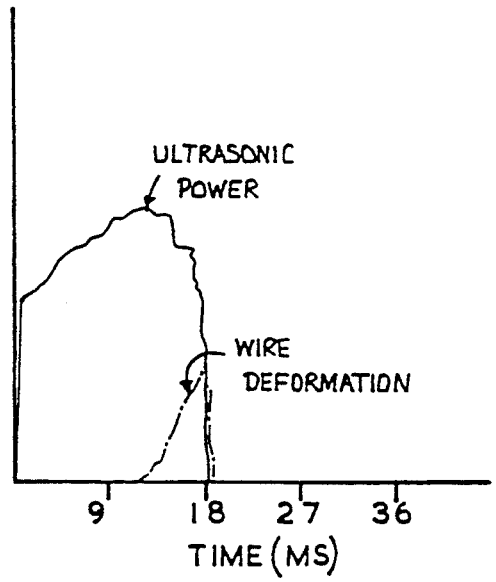
FIG. 2 is a graph showing wire deformation against time using ultrasonic energy controlled according to wire deformation and constant bond weight (for an aluminium bonding wire having a thickness of 25 micron)

In FIG. 2, a bonding process using ultrasonic energy controlled according to wire deformation is shown. The wire being bonded is a thin wire, having a thickness of 25 micron, and the bonding is a two-stage process.

In the first stage, energy is supplied at a relatively high level, and there is almost no deformation of the wire. This is because during this stage, for the first approximately 12 milliseconds of the bonding process, the surface of the wire and the contact surface are being cleaned of surface contamination. This contamination generally takes the form of surface oxidation and may also comprise organic contamination.

As can be seen from FIG. 2, when cleaning is complete, there is a sharp increase in deformation as the second stage is initiated. During the second stage, the level of the ultrasonic energy is reduced and when the deformation of the wire reaches a predetermined value, the energy is switched off since the bond is completed.

Figure 3:
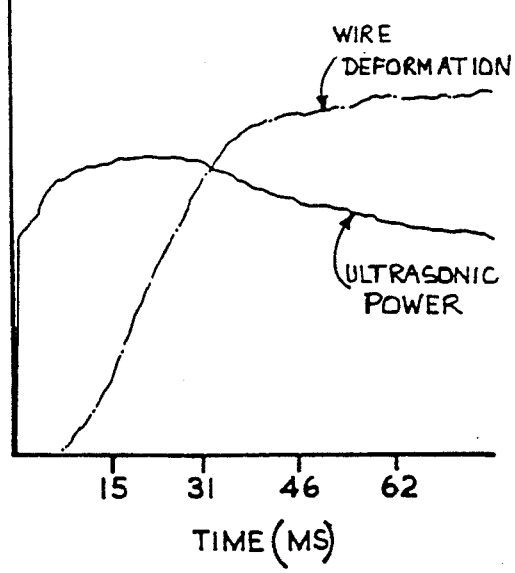
FIG. 3 is a graph showing wire deformation against time using ultrasonic energy controlled according to wire deformation and constant bond weight (for an aluminium wire having a thickness of 250 micron)
Figure 6:
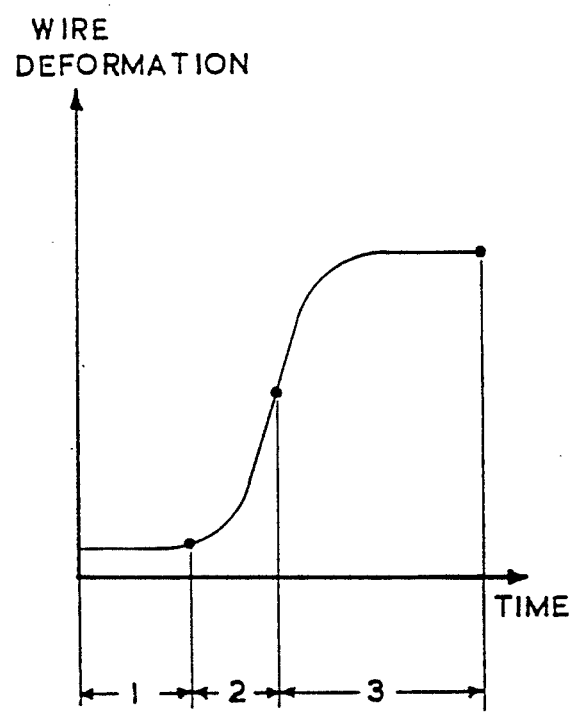
FIG. 6 is a graph showing the three stages in the wire bonding process.

In FIG. 3, a second bonding process using ultrasonic energy controlled according to wire deformation is shown. The wire being bonded is a thick wire, having a thickness of 250 micron, and the bonding is a three-stage process. The first two stages of cleaning and welding correspond to the first two stages of the process shown in FIG. 2. There is however a third stage during which energy continues to be supplied to the bond, according to a predetermined curve, in order to heat the bond and allow tempering of the bond at elevated temperature.

Figure 4:
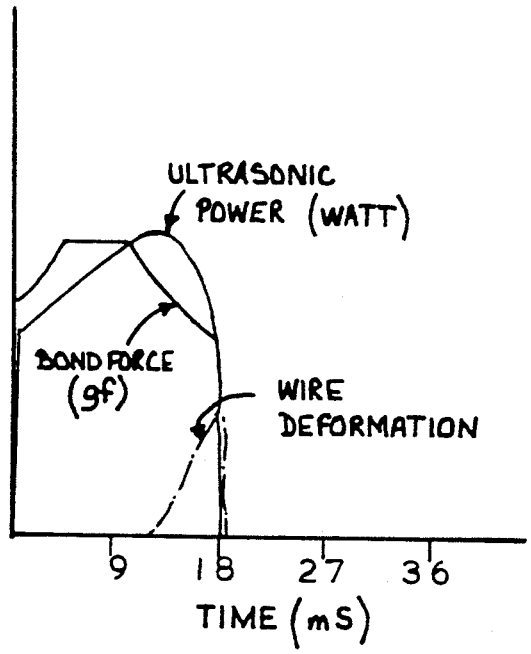
FIG. 4 is a graph showing wire deformation against time using ultrasonic energy and bond weight controlled according to wire deformation (for an aluminium bonding wire having a thickness of 25 micron)

In FIG. 4, a bonding process using ultrasonic energy and bond weight controlled according to wire deformation is shown. The wire being bonded is a thin wire, having a thickness of 25 micron, and the bonding is a two-stage process.

In the first stage, energy is supplied at a relatively high level, with a relatively high bond weight and there is almost no deformation of the wire. This is because during this stage, for the first approximately 12 milliseconds of the bonding process, the surface of the wire and the contact surface are being cleaned of surface contamination. This contamination generally takes the form of surface oxidation and may also comprise organic contamination.

As can be seen from FIG. 4 when cleaning is complete, there is a sharp increase in deformation as the second stage is initiated. During the second stage, the level of the ultrasonic energy and the bond weight are reduced and when the deformation of the wire reaches a predetermined value, the energy is switched off since the bond is completed.

Figure 5:
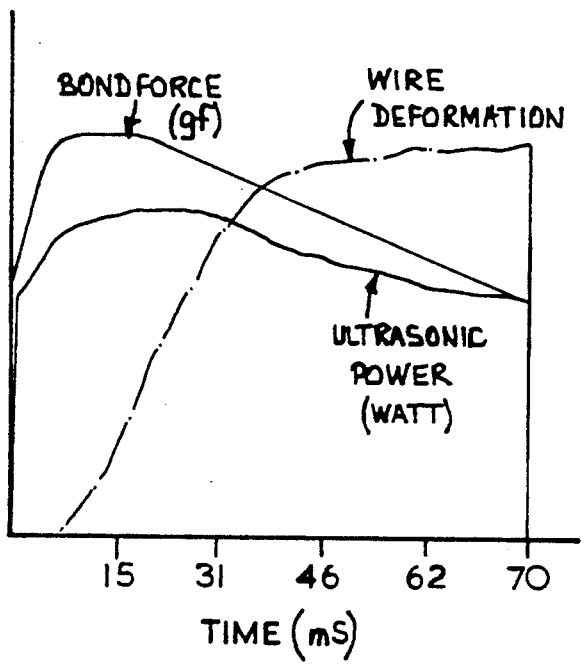
FIG. 5 is a graph showing wire deformation against time using ultrasonic energy and bond weight controlled according to wire deformation (for an aluminium wire having a thickness of 250 micron)

In FIG. 5, a second bonding process using ultrasonic energy and bond weight controlled according to wire deformation is shown. The wire bonded is a thick wire, having a thickness of 250 micron, and the bonding is a three-stage process. The first two stages of cleaning and welding correspond to the first two stages of the process shown in FIG. 4. There is however a third stage during which energy continues to be supplied to the bond, according to a predetermined curve, in order to heat the bond and allow tempering of the bond at elevated temperature.

In the first stage, the surface of the wire and the contact surface to which it is to be bonded are subjected to a cleaning process and there is relatively little if any deformation of the wire. During the second stage, there is rapid deformation of the wire as the weld is formed. During the third stage, the rate of deformation of the wire reduces rapidly as the weld is completed and tempering takes place.

Figure 7:
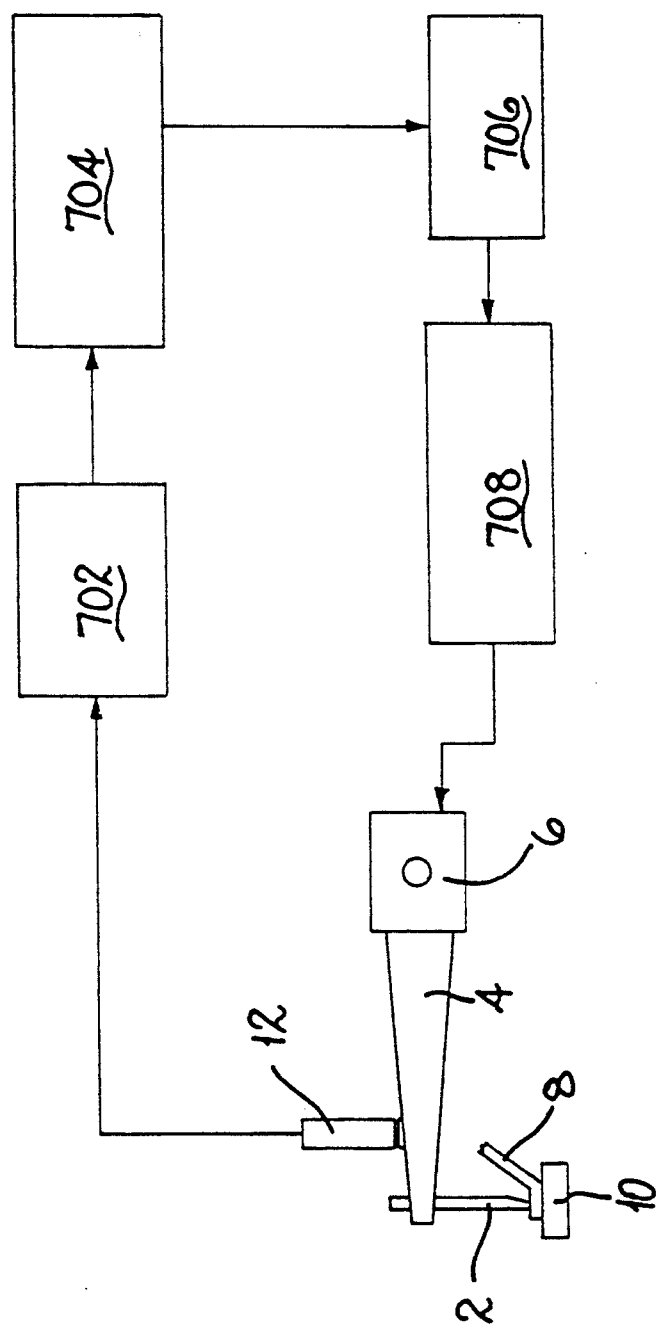
FIG. 7 and 8 are block diagrams', of two alternative embodiments of an automatic wire bonding apparatus.

An embodiment of an automatic wire bonding apparatus is shown diagrammatically in FIG. 7.

The automatic wire bonding machine comprises a bonding wedge 2 which is attached to a horn 4 of an ultrasonic vibration transducer 6. Wire 8 for bonding to a component 10 is fed from a wire spool (not shown) in known manner. A deformation sensor 12 is connected in a closed loop system to a wire deformation measuring system 702 which is connected via a processor 704 to an ultrasonic regulator 706 which is itself connected to an ultrasonic power generator 708 which drives the transducer 6.

In operation, data from the deformation sensor 12 is fed via the wire deformation measuring system 702 to the processor 704 where the process is continually monitored and the required level of ultrasonic energy calculated. Data on the calculated level is then used to control the ultrasonic generator 708 by means of the ultrasonic regulator 706.

The deformation sensor 12 and wire deformation measuring system 702 may be any suitable deformation system such as an electronic system or an optical system, for example a laser system.

Figure 8:
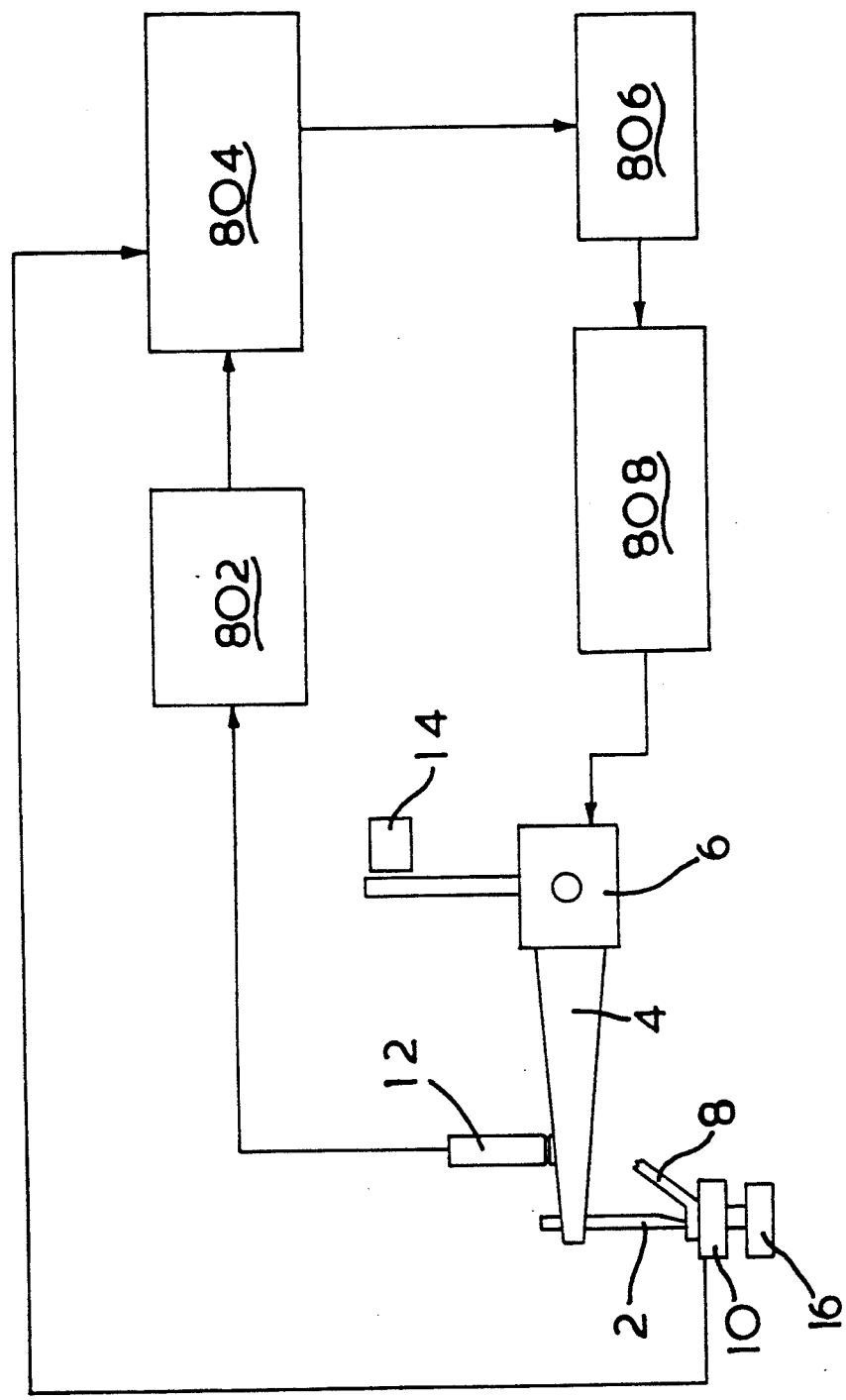

An alternative embodiment of an automatic wire bonding apparatus is shown diagrammatically in FIG. 8.

The automatic wire bonding machine comprises a bonding wedge 2 which is attached to a horn 4 of an ultrasonic vibration transducer 6. Wire 8 for bonding to a component 10 is fed from a wire spool (not shown) in known manner. A deformation sensor 12 is connected in a closed loop system to a wire deformation measuring system 802 which is connected via a processor 804 to an ultrasonic regulator 806 which is itself connected to an ultrasonic power generator 808 which drives the transducer 6.

A bond force regulator 14 is attached to the horn 4 of the ultrasonic vibration transducer 6. A piezo table 16 is positioned below the component 10 to measure bond force.

In operation, data from the deformation sensor 12 is fed via the wire deformation measuring system 802 to the processor 804 where the process is continually monitored and the required level of ultrasonic energy calculated. Data on the calculated level is then used to control the ultrasonic generator 808 by means of the ultrasonic regulator 806. In a similar manner, data from the piezo table 16 is used to control the bond force regulator 14 and deliver the information to processor 804.

The deformation sensor 12 and wire deformation measuring system 802 may be any suitable deformation system such as an electronic system or an optical system, for example a laser system.

I claim:

1. A wire bonding apparatus for bonding a wire to a workpiece surface wherein the wire and/or the surface may have surface contamination which would interfere with the establishment of a good bond comprising
   an ultrasonic transducer including a horn,
   a bonding wedge secured to said horn for supporting a wire against the surface, whereby operation of said transducer will result in rapid displacement between the wire and the surface,
   means for sensing the deformation of the wire,
   means for determining when there is a sharp increase in the deformation of the wire,
   means for operating said transducer at a high energy level until said determining means determines that there is a sharp increase in the deformation of the wire and for operating said transducer at a low energy level when said determining means determines that there is a sharp increase in the deformation of the wire.

2. A wire bonding apparatus according to claim 1, wherein said determining means further comprises
   means for determining when wire deformation has reached a predetermined value, and further comprising
   means for turning said transducer off when said determining means determines that wire deformation has reached said predetermined value.

3. A wire bonding apparatus according to claim 1, wherein said determining means further comprises means for determining when wire deformation has reached a predetermined value, and said operating means further comprises means for operating said transducer at a level for tempering the bond between the wire and the surface when said determining means determines that wire deformation has reached said predetermined value.

4. A method for bonding a wire to a workpiece surface wherein the wire and/or the surface may have surface contamination which would interfere with the establishement of a good bond in a wire bonding apparatus having an ultrasonic transducer including a horn, a bonding wedge secured to the horn for supporting a wire against the surface, whereby operation of the transducer will result in rapid displacement between the wire and the surface, and means for sensing the deformation of the wire, comprising
   determining when there is a sharp increase in the deformation of the wire,
   operating the transducer at a high energy level until the sharp increase in the deformation of the wire is determined, and
   operating the transducer at a low energy level when a sharp increase in the deformation of the wire is determined.

5. A wire bonding method according to claim 4, further comprising
   determining when wire deformation has reached a predetermined valve, and
   turning the transducer off when wire deformation has reached said predetermined value.

6. A wire bonding method according to claim 4, further comprising
   determining when wire deformation has reached a predetermined value, and
   operating the transducer at a level for tempering the bond between the wire and the surface when said predetermined value is reached.

* * * * *